US009365395B2

(12) United States Patent
Fargo et al.

(10) Patent No.: US 9,365,395 B2
(45) Date of Patent: *Jun. 14, 2016

(54) ELEVATOR LOAD BEARING MEMBER

(71) Applicant: OTIS ELEVATOR COMPANY, Farmington, CT (US)

(72) Inventors: Richard N. Fargo, Plainville, CT (US); Jun Ma, Farmington, CT (US); Mark R. Gurvich, Middletown, CT (US); Martin J. Hardesty, West Hartford, CT (US)

(73) Assignee: Otis Elevator Company, Farmington, CT (US)

( * ) Notice: Subject to any disclaimer, the term of this patent is extended or adjusted under 35 U.S.C. 154(b) by 180 days.

This patent is subject to a terminal disclaimer.

(21) Appl. No.: 14/023,798

(22) Filed: Sep. 11, 2013

(65) Prior Publication Data
US 2014/0008153 A1  Jan. 9, 2014

Related U.S. Application Data

(63) Continuation of application No. 12/675,829, filed as application No. PCT/US2007/079646 on Sep. 27, 2007, now Pat. No. 8,556,040.

(51) Int. Cl.
*B66B 7/06* (2006.01)
*D07B 5/00* (2006.01)
*D07B 1/22* (2006.01)

(52) U.S. Cl.
CPC ............ *B66B 7/062* (2013.01); *D07B 5/005* (2013.01); *D07B 5/006* (2015.07); *D07B 1/22* (2013.01); *D07B 2201/2086* (2013.01); *D07B 2501/2007* (2013.01)

(58) Field of Classification Search
CPC ... B66B 7/062; D07B 1/22; D07B 2201/2087
USPC ......................................... 187/250, 251, 254
See application file for complete search history.

(56) References Cited

U.S. PATENT DOCUMENTS

| 2,332,495 | A | * | 10/1943 | Bass ............................. 474/254 |
| 3,049,460 | A | | 8/1962 | Garbin et al. |
| 3,851,535 | A | | 12/1974 | Presentey |
| 3,948,113 | A | | 4/1976 | Stork et al. |
| 4,227,041 | A | * | 10/1980 | Den et al. .................... 174/117 F |
| 4,265,627 | A | | 5/1981 | Imamura |

(Continued)

FOREIGN PATENT DOCUMENTS

| EP | 177189 A1 | 4/1986 |
| EP | 1396458 A2 | 3/2004 |

OTHER PUBLICATIONS

International Search Report and Written Opinion of the International Searching Authority for International application No. PCT/US2007/079646 mailed Jun. 5, 2008.

(Continued)

*Primary Examiner* — William A Rivera
*Assistant Examiner* — Michael Riegelman
(74) *Attorney, Agent, or Firm* — Carlson, Gaskey & Olds

(57) ABSTRACT

A load bearing member for supporting an elevator car has a plurality of tension members that bear the weight of the elevator car. The plurality of tension members extends along a length. An outer cover at least partially covers the plurality of tension members and has a first surface and a second surface.

9 Claims, 5 Drawing Sheets

(56) References Cited

U.S. PATENT DOCUMENTS

| | | | |
|---|---|---|---|
| 4,773,896 A | 9/1988 | Bouteiller et al. | |
| 5,026,444 A | 6/1991 | Hollaway et al. | |
| 6,364,063 B1 | 4/2002 | Aulanko et al. | |
| 6,371,448 B1 | 4/2002 | De Angelis | |
| 6,386,324 B1 | 5/2002 | Baranda et al. | |
| 6,390,242 B1 | 5/2002 | Baranda et al. | |
| 6,419,208 B1 | 7/2002 | Baranda et al. | |
| 6,488,123 B2 | 12/2002 | Pitts et al. | |
| 6,672,046 B1 | 1/2004 | Prewo et al. | |
| 6,739,433 B1 | 5/2004 | Baranda et al. | |
| 6,742,769 B2 | 6/2004 | Baranda et al. | |
| 7,326,139 B2 | 2/2008 | Eichhorn et al. | |
| 2002/0108814 A1 | 8/2002 | John et al. | |
| 2004/0206579 A1* | 10/2004 | Baranda et al. | 187/254 |
| 2008/0087500 A1 | 4/2008 | Ach et al. | |
| 2010/0133046 A1* | 6/2010 | Allwardt et al. | 187/251 |
| 2012/0103730 A1 | 5/2012 | Hoerler | |

OTHER PUBLICATIONS

International Preliminary Report on Patentability for International Application No. PCT/US2007/079646 mailed Dec. 23, 2009.

Extended European Search Report for Application No. EP 12 17 0600 dated Jul. 26, 2012.

\* cited by examiner

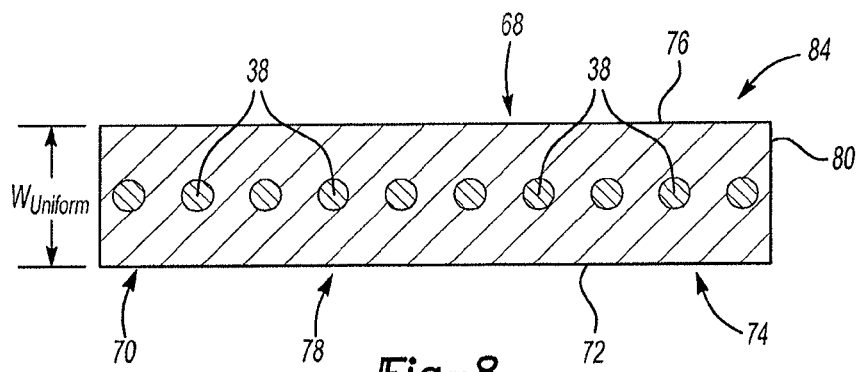
Fig-8
*PRIOR ART*
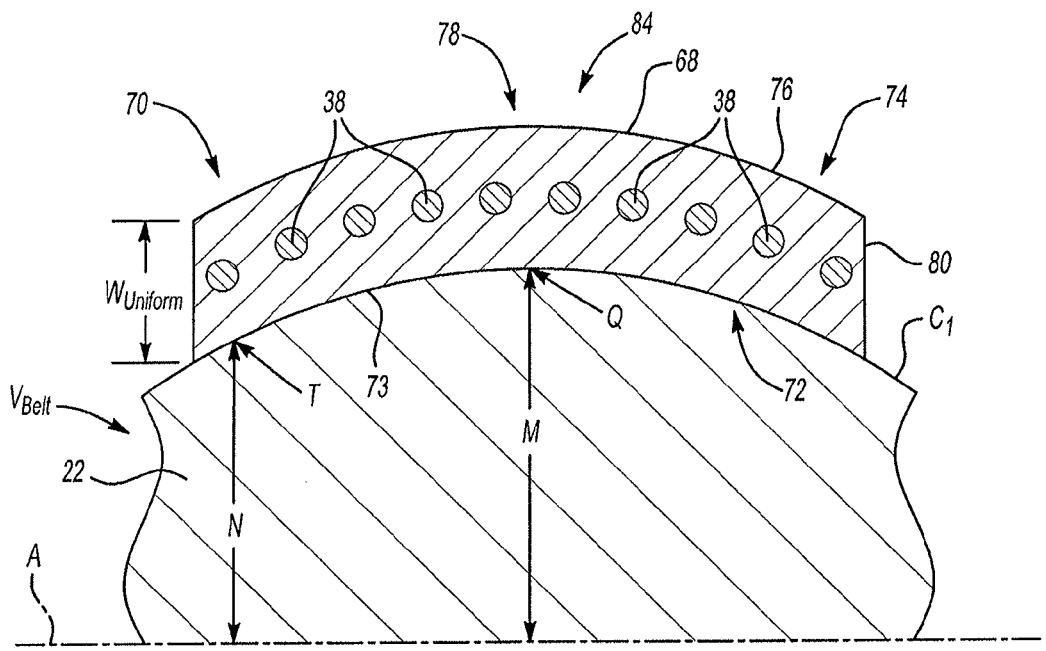
Fig-9 *PRIOR ART*
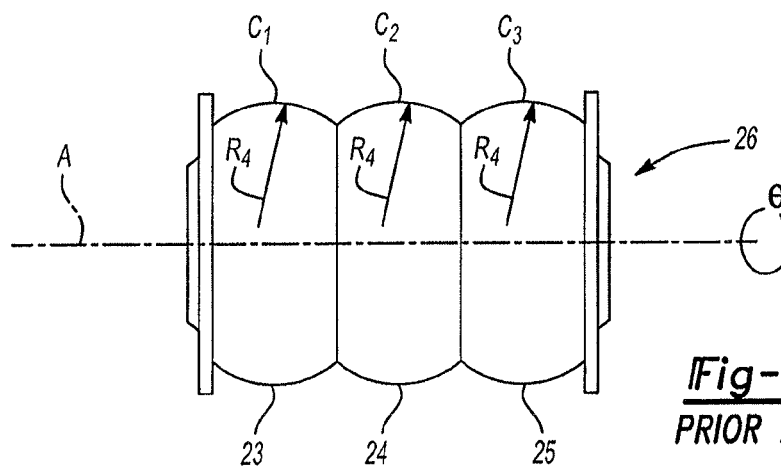
Fig-10
*PRIOR ART*

ELEVATOR LOAD BEARING MEMBER

CROSS REFERENCE TO RELATED APPLICATION

This application is a continuation of U.S. patent application Ser. No. 12/675,829, filed Mar. 1, 2010.

BACKGROUND OF THE INVENTION

This invention generally relates to a belt for supporting an elevator car.

An elevator has a car that is raised and lowered by a motor. Typically, a counterweight is used to offset the weight of the car so that the load on the motor is reduced. A belt connects the car to the counterweight and rests on a sheave. The belt obtains traction on the sheave, which is turned by the motor. Typically, the belt for the elevator car is composed of belt cords that support the weight of the elevator. These belt cords are very stiff along their length and are surrounded by a belt jacket that obtains traction on the sheave.

It has long been known in the industry that using a crown on a sheave will help the belt track toward the center of the sheave, even when the belt is slightly misaligned. While the crown may help the belt track better, the crown can degrade its performance. Specifically, due to the shape of the crown, pressure at the interface between the sheave and the belt is non-uniform. A high peak pressure will exist at the top of the crown, resulting in reduced life of the belt jacket and the belt cords.

In addition, because of the stiffness of the belt cords, these cords tend to move at the same speed. The speed of the sheave surface is directly proportional to the distance between a centerline of the sheave and its surface. Consequently, the peak of the crown travels at a higher circumferential speed than the remainder of the sheave surface. Because the belt cords all move at the same speed, and the speed of the sheave surface varies due to the crown, there are locations where the belt surface and the corresponding sheave surface will have different speeds. As a consequence, there is localized slipping between the belt surface and the sheave surface, resulting in belt wear.

A need therefore exists for a belt having a profile that accommodates the shape of the crown of the sheave.

SUMMARY

A belt for supporting an elevator car has tension members that bear the weight and counterweight of the car. The tension members extend along a length. An outer cover envelopes the plurality of tension members. The outer cover has a first surface and a second surface. The first surface provides traction for a sheave. The second surface may contact idler sheaves associated with reverse bending. The tension members are sandwiched between the first surface and the second surface. The first surface and the second surface define a cross-section transverse to the length of the tension members. The cross-section has a first end portion, a middle portion and a second end portion. The middle portion has a first width between the first surface and the second surface that is smaller than a width between the first surface and the second surface of either the first end portion or the second end portion.

The various features and advantages of this invention will become apparent to those skilled in the art from the following detailed description. The drawings that accompany the detailed description can be briefly described as follows.

BRIEF DESCRIPTION OF THE DRAWINGS

FIG. 8 is a cross-section of a prior art belt design.

FIG. 9 is a view of the prior art belt design of FIG. 8 atop a crown of a sheave.

FIG. 10 is a front view of another sheave of FIG. 1.

DETAILED DESCRIPTION

Figure 1:
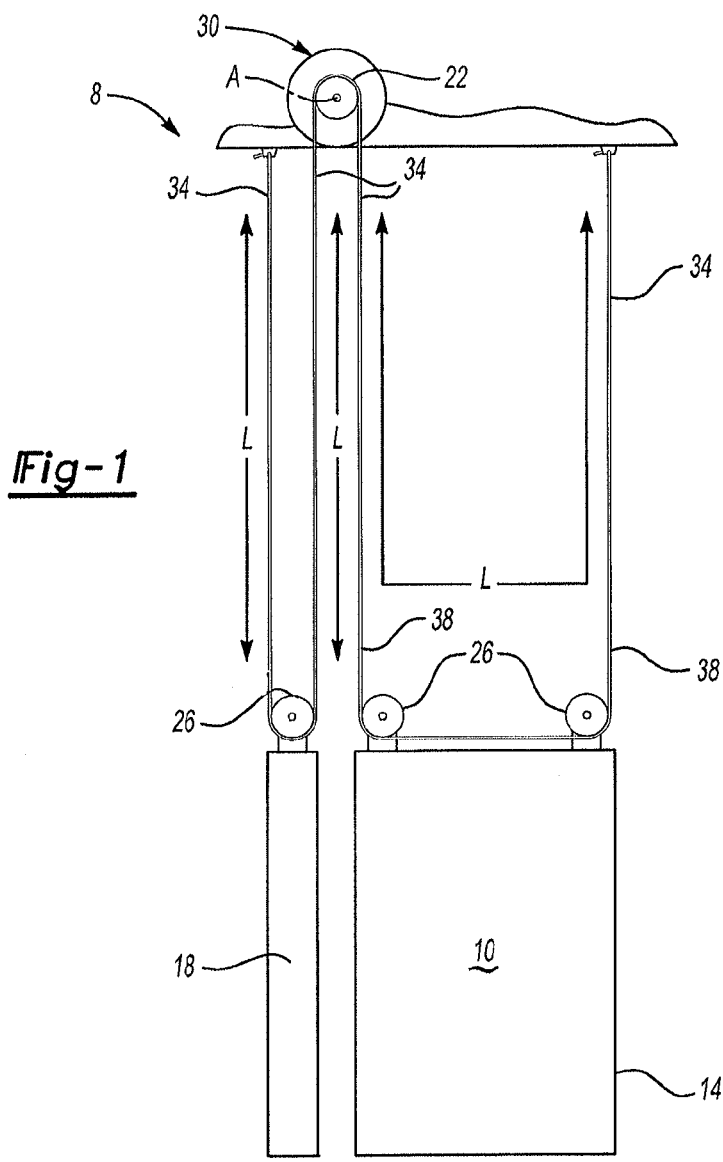
FIG. 1 illustrates a schematic view of an elevator, showing elevator car, counterweight, sheaves and load bearing member.

Illustrated in FIG. 1 is a schematic view of a traction elevator 8. The elevator 8 includes an elevator car 10 having weight 14, a counterweight 18, a motor 30 and first sheave 22, a traction sheave. The elevator car 10 is suspended by load bearing member 34. Tension members 38 extend along length L of load bearing member 34, a belt for example. Load bearing member 34 is driven by first sheave 22 and motor 30 and is looped across second sheaves 26 as known. Further, load bearing member 34 couples the weight of counterweight 18 to elevator car 10 having weight 14 so as to at least offset the weight 14 of elevator car 10.

Figure 2:
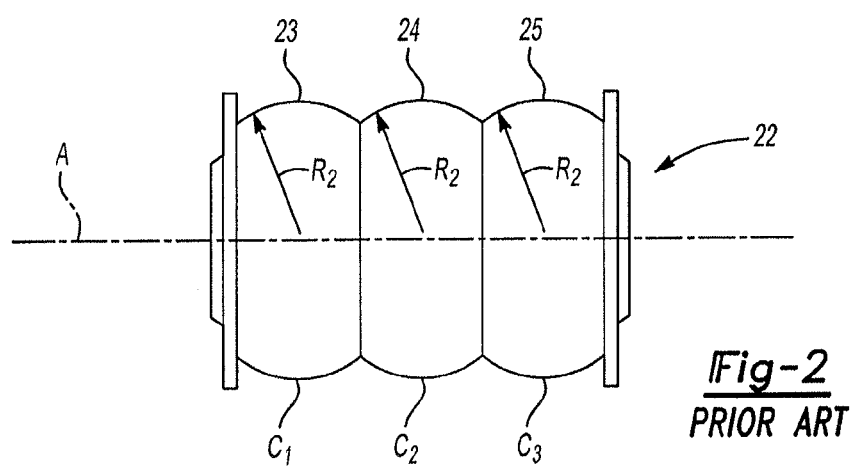
FIG. 2 illustrates a front view of a sheave of FIG. 1.

FIG. 2 illustrates a front view of first sheave 22, a traction sheave, which is rotatable by motor 30 about axis A. In this particular sheave, first sheave 22 has multiple contact surfaces 23, 24 and 25, which are convex and adapted to engage through friction three separate load bearing members 34. As shown, each contact surface 23, 24, 25 has a crown $C_1$, $C_2$ and $C_3$, respectively. Each crown $C_1$, $C_2$ and $C_3$ has a radius $R_2$.

In the past, a load bearing member was typically flat as shown in cross-section by FIG. 8. This figure shows flat belt 84 in cross-section across its length. Flat belt 84 has first end portion 70, middle portion 78 and second end portion 74 across cross-section 68. Across the length of flat belt 84 are a plurality of tension members 38, such as steel cords, sandwiched between first surface 72 and second surface 76 of outer cover 80. The width $W_{uniform}$ between first surface 72 and second surface 76 is uniform.

First surface 72 obtains traction on first sheave 22. Due to the curved shape of a crown, Poisson's ratio effects and loading, the geometry of flat belt 84 changes when disposed on first sheave 22, as shown in FIG. 9. There, flat belt 84 is shown disposed on first sheave 22, having crown $C_1$. As shown, flat belt 84 has changed from a flat shape to a curved shape.

Figure 5:
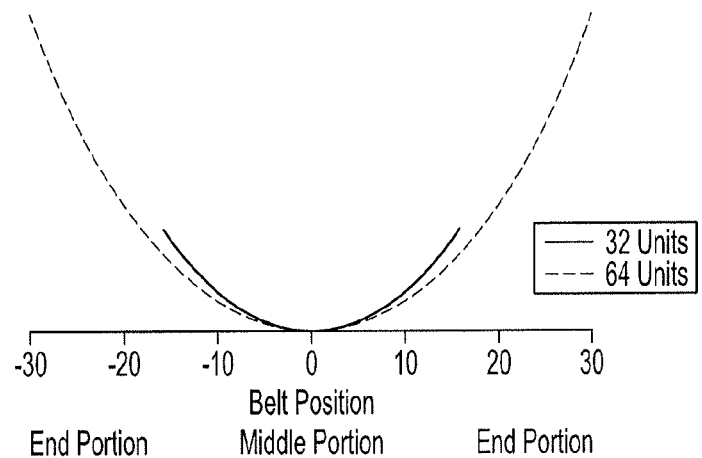
FIG. 5 illustrates a graph of an increase of slip rate relative to belt position for a prior art flat belt.

With reference to FIG. 9, because of the stiffness of tension members 38, tension members 38 will move at about the same speed, $V_{belt}$, when first sheave 22 rotates in use. For example, first sheave 22 rotates about axis A, at say angular speed $\ominus$. At point T, crown surface 73 is distance N from axis A while at point Q, crown surface 73 is distance M from axis A, which is a distance greater than distance N. Therefore, the velocity of crown surface 73 at point T is Vt=N×Θ while the velocity of crown surface 73 at point Q is Vq=M×Θ. Because M is greater than N, the velocity of crown surface 73 at point Q, $V_q$, is greater than the velocity of crown surface 73 at point T, Vt. Flat belt 84 will tend to move with first sheave 22 at point Q because the pressure is greater there. However, with reference to FIG. 5, flat belt 84 will then slip at the edges because $V_{belt}=V_q$, which is greater than $V_t$. The slip rate at point T is approximately $V_{belt}-V_t$.

Figure 6:
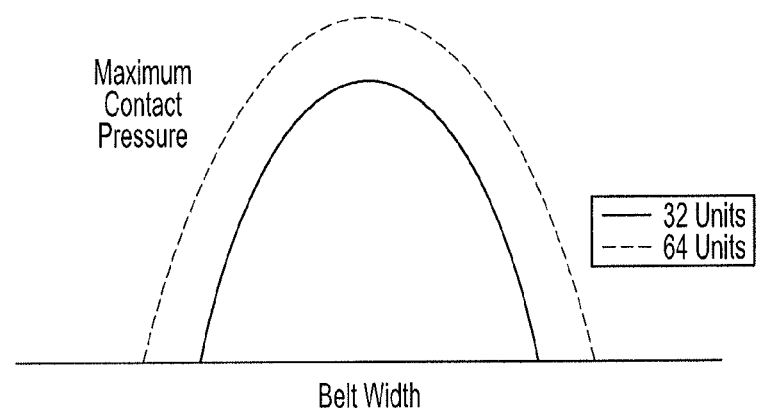
FIG. 6 illustrates contact pressure across the belt width of a prior art flat belt.

Wear rate is a function of pressure multiplied by slip rate and is highest near the outer edges where there is high slip and moderate pressure. Consequently, non-uniform wear results leading to greater wear at the edges than at the middle of flat belt 84. These differences also result in tension members 38 changing length due to strain at different levels, again causing non-uniform wear on flat belt 84. In addition, as shown in FIG. 6, for any given load on the belt, the load on flat belt 84 tends to be greater at the middle of the belt than compared to the end of the cross-section of the belt. As a consequence, flat belt 84 will wear unevenly.

Figure 3:
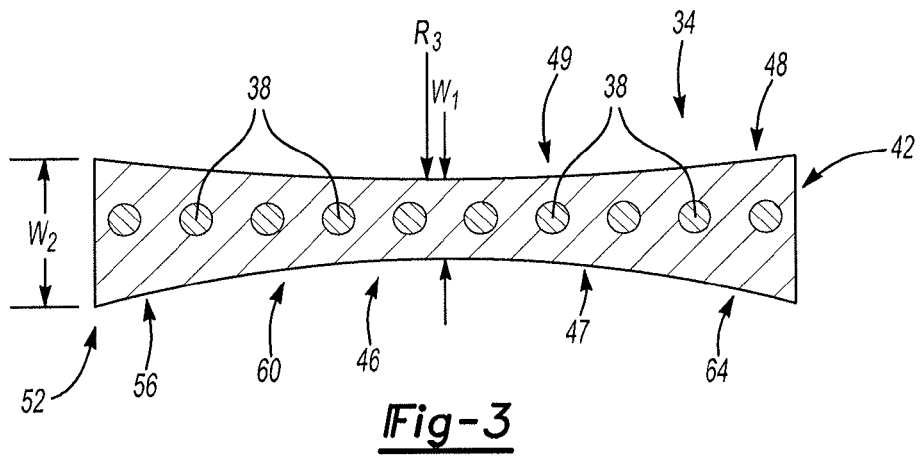
FIG. 3 illustrates a cross-sectional view of the load bearing member of FIG. 1.

FIG. 3 illustrates an example of the inventive load bearing member. Load bearing member 34 is shown in cross-section 52 transverse to length L of load bearing member 34 as shown in FIG. 1. Load bearing member 34 has outer cover 42 having first surface 46 and second surface 48, which envelops or at least partially covers tension members 38, here sandwiched between first surface 46 and second surface 48. Tension members 38 may be, for example, steel cords. Each of the tension members 38 extends for the length L of load bearing member 34 and is shown also in cross-section by FIG. 3. Load bearing member 34 has cross-section 52 defined by first surface 46 and second surface 48. Cross-section 52 has first end portion 56, middle portion 60 and second end portion 64.

Generally, the shape of load bearing member 34 is matched to crown $C_1$ and tension members 38 are disposed between first surface 46 and second surface 48 so as to ensure that they extend along a line parallel to axis A when placed and loaded on first sheave 22. Accordingly, in FIG. 3, first surface 46 forms first curve 47 while second surface 48 forms second curve 49. Both curves are concave. First surface 46 is for traction on first sheave 22 and generally matches the curved shape of a crown, such as crown $C_1$, of first sheave 22.

Figure 4:
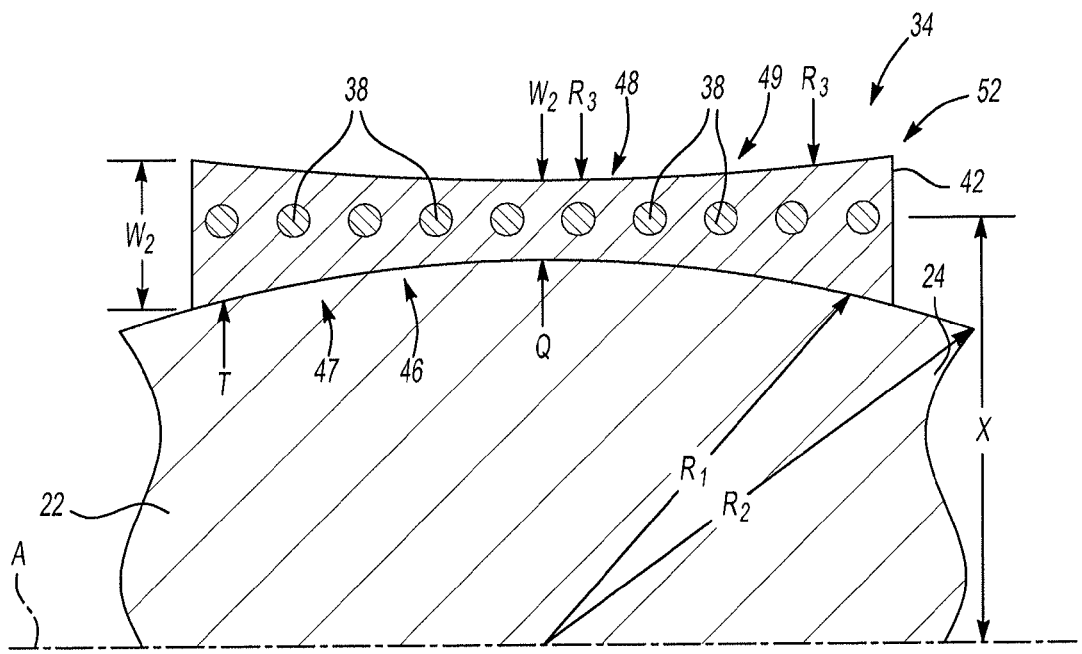
FIG. 4 illustrates a cross-sectional view of the load bearing member of FIG. 3 atop the sheave of FIG. 2.

With reference to FIG. 4, load bearing member 34 has first curve 47 having first radius $R_1$. First sheave 22, the traction sheave, has a crown with second radius $R_2$. First radius $R_1$ is at least equal to $R_2$ although $R_1$ may be greater than $R_2$. Middle portion 60 has first width $W_1$ while first end portion 56 and second end portion 64 have second width $W_2$. First width $W_1$ is smaller than second width $W_2$.

As a consequence of this design, when load bearing member 34 is placed atop first sheave 22, the plurality of tension members 38 tend to extend across cross-section 52 in a linear fashion along axis A of first sheave 22. Tension members 38 are all about distance X from axis A, including at points T and Q. Then, when first sheave 22 rotates load bearing member 34, the plurality of tension members 38 will rotate about the same distance X from axis A so that tension members 38 will all have the same velocity, resulting in reduced slippage of load bearing member 34 across cross-section 52. In addition, tension members 38 will maintain the same length. By keeping the same length, the strain and corresponding stress on tension members 38 are equal. Slippage is also reduced and a more uniform pressure across load bearing member 34 results, reducing wear. Accordingly, outer cover 42 is shaped to fill the space between tension members 38 and first sheave 22 so that they rotate at the same distance X from axis A when load bearing member 34 is disposed on first sheave 22 and supporting weight 14 and counterweight 18.

Figure 7:
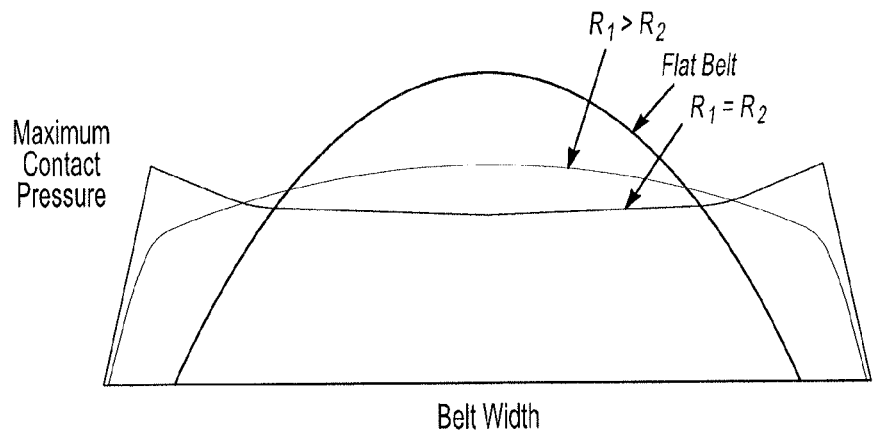
FIG. 7 illustrates contact pressure across the belt width of a flat belt compared to the inventive belt.

In addition, as shown in FIG. 7, contact pressure is distributed more uniformally across load bearing member 34. For example, when first radius $R_1$ is equal to second radius $R_2$, that is, the radius of the first surface 46 is equal to the radius $R_2$ of first sheave 22, a relatively flat distribution of pressure is achieved across the crown of first sheave 22, such as crown $C_1$. In addition, when first radius $R_1$ is greater than $R_2$, the distribution of pressure is also relatively flat compared to the distribution of force across a flat belt.

FIG. 10 illustrates a front view of second sheave 26. Like first sheave 22, second sheave 26 has contact surfaces 23, 24 and 25. One surface, such as contact surface 23, contacts load bearing member 34 along second surface 48. Each contact surface 23, 24 and 25 has crowns surfaces $C_1$, $C_2$ and $C_3$. Crown $C_1$ has radius $R_4$, for example, relative to axis A.

With reference to FIG. 3, second surface 48 is for contact with second sheave 26 for reverse bending of load bearing member 34 and generally matches the curved shape of a crown, such as crown $C_1$, of second sheave 26. Second surface 48 forms a concave curve, second curve 49, having a third radius $R_3$, which is at least equal to, if not greater than, radius $R_4$ of crown $C_1$ of sheave 26. In this way, wear from contact with second sheave 26 can be also reduced like the wear from contact with first sheave 22.

Figure 11:
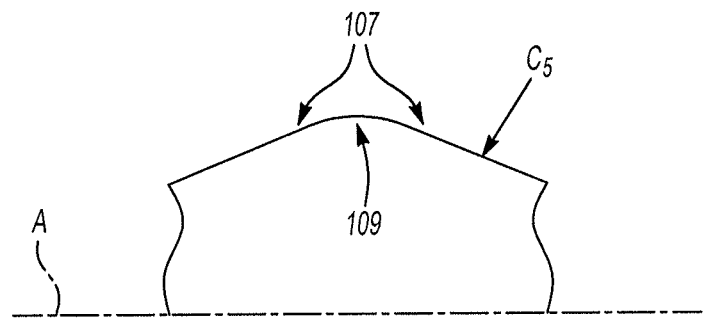
FIG. 11 is a view of an alternatively shaped crown.
Figure 12:
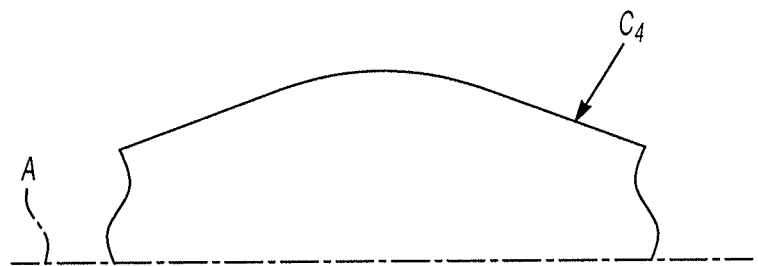
FIG. 12 is a view of another crown.

In addition, although crowns $C_1$, $C_2$ and $C_3$ of second sheave 26 are shown as identical to crowns of first sheave 22, they may differ. For example, second sheave 26 could have crown $C_4$, a parabolic shaped curve, as shown in FIG. 12 or crown $C_5$, having straight ramps 107 with curved peak 109, as shown in FIG. 11, while first sheave 22 could have crowns $C_1$, $C_2$ or $C_3$. Alternatively, first sheave 22 could have the crowns $C_4$ and $C_5$ while second sheave 26 could have crown $C_1$, $C_2$ or $C_3$.

Figure 13:
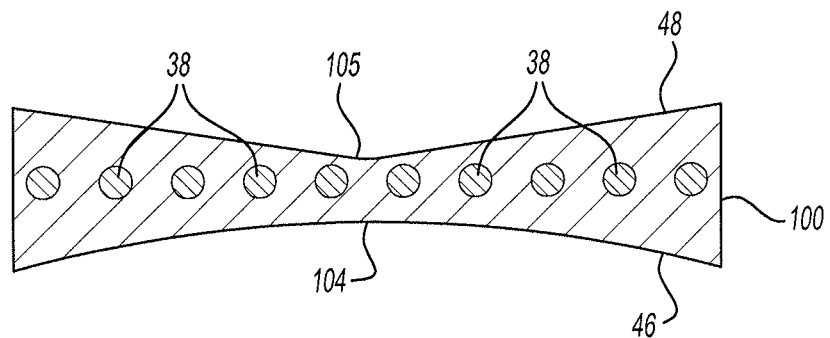
FIG. 13 is a view of another inventive belt design.

Then, for example, with reference to FIG. 13, load bearing member 100 has first surface 46 having shape 104 to match crown $C_1$ of first sheave 22 and has second surface 48 having shape 105 to match crown $C_4$, a parabolic curve. Each shape 104 and 105 thereby ensures tension members 38 will rotate at the same distance from axis of rotation H of each respective sheave. Shape 104 ensures this equidistant rotation of tension members 38 with respect to first sheave 22 while shape 105 ensures equidistant rotation of tension members 38 with respect to second sheave 26.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. An elevator load bearing member, comprising:
   a plurality of tension members for bearing weight associated with an elevator car, said plurality of tension members extending along a length;
   an outer cover at least partially covering said plurality of tension members;
   said outer cover having a first surface and a second surface, said plurality of tension members being situated between said first surface and said second surface, said first surface being configured for traction engagement on a sheave;
   wherein said first surface and said second surface define a cross-section transverse to said length, said cross-section having a first end portion, a middle portion, and a second end portion;

wherein said middle portion has a first width between said first surface and said second surface, wherein said first width is smaller than a second width between said first surface and said second surface, said second width being at one of said first end portion and said second end portion; and wherein each of said first end portion, said middle portion and said second end portion includes at least one of said tension members, at least one of said tension members in said middle portion is spaced closer to said first surface than at least one of said tension members in one of said first end portion and said second end portion.

2. The load bearing member of claim 1 wherein said second width is at said first end portion and said second width is at said second end portion.

3. The load bearing member of claim 1 wherein said first surface defines at least a first curve.

4. The load bearing member of claim 3 wherein said first curve has a first radius at least equal to a second radius of a crown of the sheave prior to loading said outer cover on the sheave.

5. The load bearing member of claim 4 wherein said first radius is greater than said second radius.

6. The loading bearing member of claim 3 wherein said second surface defines at least a second curve.

7. The loading bearing member of claim 6 wherein said first curve is shaped differently than said second curve.

8. The load bearing member of claim 1 wherein said first surface defines a first shape matching a second shape of a crown of the sheave prior to loading of said outer cover on the sheave.

9. The load bearing member of claim 8 wherein said first shape locates said plurality of tension members about equally distant from an axis of rotation of the sheave when said outer cover is disposed on a crown of the sheave.

* * * * *